United States Patent [19]
Tsutsumi et al.

[11] Patent Number: 6,075,426
[45] Date of Patent: Jun. 13, 2000

[54] SURFACE ACOUSTIC WAVE DEVICE WITH AN ANGLE α RELATED TO SPECIFIC PIEZOELECTRIC SUBSTRATES

[75] Inventors: Jun Tsutsumi; Takashi Matsuda; Osamu Ikata; Yoshio Satoh, all of Kawasaki, Japan

[73] Assignee: Fujitsu Limited, Kawasaki, Japan

[21] Appl. No.: 09/153,336

[22] Filed: Sep. 15, 1998

[30] Foreign Application Priority Data

May 14, 1998 [JP] Japan .................................. 10-131980

[51] Int. Cl.⁷ ............................. H03H 9/145; H03H 9/64
[52] U.S. Cl. ...................... 333/193; 333/195; 310/313 B
[58] Field of Search ................... 333/193–196; 310/313 R, 313 B, 313 C, 313 D

[56] References Cited

U.S. PATENT DOCUMENTS

| | | | |
|---|---|---|---|
| 4,162,465 | 7/1979 | Hunsinger et al. | 333/194 X |
| 4,672,255 | 6/1987 | Suzuki et al. | 310/313 A |
| 5,274,345 | 12/1993 | Gau | 333/153 |
| 5,818,146 | 10/1998 | Kurahashi et al. | 310/313 R |
| 5,831,492 | 11/1998 | Solie | 333/193 |

FOREIGN PATENT DOCUMENTS

| | | | |
|---|---|---|---|
| 54-17647 | 2/1979 | Japan | 333/194 |
| 56-10724 | 2/1981 | Japan | 333/194 |
| 60-236312 | 11/1985 | Japan . | |
| 61-6917 | 1/1986 | Japan . | |
| 3-133209 | 6/1991 | Japan . | |
| 8-288780 | 11/1996 | Japan . | |

*Primary Examiner*—Robert Pascal
*Assistant Examiner*—Barbara Summons
*Attorney, Agent, or Firm*—Staas & Halsey, LLP

[57] ABSTRACT

A surface acoustic wave device includes a piezoelectric substrate and plural IDTs for sending and receiving SAW mounted on the substrate. At least one of the IDTs includes a positive electrode including plural positive split electrodes (PSEs) and a negative electrode including plural negative split electrodes (NSEs). The PSEs and NSEs are arranged alternately. Each of the PSEs andNSEs has apair of electrode fingers. Two electrode fingers of each of the split electrodes are different in width in a direction in which a SAW is excited. An angle α determined by a direction transverse to the electrode fingers from one of the two electrode fingers having a smaller reflection factor toward the other one having a larger reflection factor and a direction in which the SAW excited by the IDT including the split electrodes travels to one of the IDTs for receiving the SAW is equal to or larger than 0° and smaller than 90°, i.e., $0 \leq \alpha < 90$.

2 Claims, 18 Drawing Sheets

42.45° Y-X : QUARTZ

45° X-Z : Li₂B₄O₇

PRIOR ART

SURFACE ACOUSTIC WAVE DEVICE WITH AN ANGLE α RELATED TO SPECIFIC PIEZOELECTRIC SUBSTRATES

CROSS-REFERENCE TO RELATED APPLICATION

This application is related to Japanese application No. HEI 10(1998)-131980, filed on May 14, 1998, whose priority is claimed under 35 USC §119, the disclosure of which is incorporated by reference in its entirety.

BACKGROUND OF THE INVENTION

1. Field of the Invention

The present invention relates to a surface acoustic wave device, particularly a surface acoustic wave device using a unidirectional interdigital transducer (referred to as IDT hereafter).

2. Description of Related Art

Conventionally, unidirectional IDTs which excite surface acoustic waves (referred to as SAW hereafter) only in one direction have been developed in order to reduce loss of IDTs which excite the SAW going forward in two directions. Among such unidirectional IDTs, unidirectional IDTs of internal reflection type, which do not need external phase circuits and can be produced by forming an electrode film and patterning only once, are of practical use and the development thereof is active.

FIG. 15 shows a unidirectional IDT of internal reflection type using a floating electrode (disclosed by Japanese Unexamined Patent Publication No. SHO 60(1985)-236312).

Here, the unidirectional IDT is realized by placing an open floating electrode and a short-circuit floating electrode between a positive excitation electrode and a negative excitation electrode. In this unidirectional IDT of internal reflection type, the excitation electrodes and the floating electrode are $\lambda/12$ in width ($\lambda$ is an electrode period, i.e., a wavelength at a center frequency at which the SAW is excited most intensively), and the electrodes are apart from each other by a center-to-center distance of $\lambda/6$.

Further, Japanese Unexamined Patent Publication No. HEI 3(1991)-133209 discloses that directivity is improved by rendering the width of the open floating electrode more than $\lambda/12$ and that of the short-circuit floating electrode less than $\lambda/12$. In this unidirectional IDT with the floating electrodes, however, the width of the excitation electrodes is as narrow as $\lambda/12$, and accordingly there is a problem in that the production of IDTs becomes more difficult as the frequency increases.

Further, an edge-to-edge distance between the positive and negative excitation electrodes is $5\lambda/12$. This is larger than an edge-to-edge distance of $\lambda/4$ in the case of a single-electrode IDT shown in FIG. 16 and an edge-to-edge distance of $\lambda/8$ in the case of an IDT with split electrodes shown in FIG. 17. Accordingly, there is a problem in that input impedance becomes greater.

In a unidirectional IDT disclosed in Japanese Unexamined Patent Publication No. SHO 61(1986)-6917, a positive electrode and a negative electrode are each composed of plural pairs of electrode fingers, the positive electrode finger pairs and the negative electrode finger pairs are alternately arranged, and the electrode fingers of each electrode finger pair are different in width, as shown in FIG. 18. Thus, the unidirectional IDT is constructed as a bilaterally asymmetric IDT. In this construction, the number of electrode fingers per period is four, and the construction is characteristic of being simpler compared with the aforesaid construction using the floating electrodes. Furthermore, the edge-to-edge distance between the positive and negative excitation electrodes is smaller than in the case of the IDT with split electrodes shown in FIG. 17. Accordingly, the input impedance is decreased.

The above-described Japanese Unexamined Patent Publication No. SHO 61(1986)-6917 states that, in the unidirectional IDT shown in FIG. 18, the SAW is excited strongly in a direction indicated by an arrow 5 in the figure. Similarly, Japanese Unexamined Patent Publication No. HEI 8(1996)-288780, also referring to the unidirectional IDT shown in FIG. 18, describes that, if the wider electrode finger of the electrode finger pair is $3\lambda/16$ wide and the narrower electrode finger of the electrode finger pair is $\lambda/16$ wide, the SAW is excited strongly in the direction indicated by the arrow 5 in FIG. 18.

On the basis of the description of these two publications, the inventors made a SAW filter using 36° Y-X: quartz as a piezoelectric substrate, the unidirectional IDT shown in FIG. 18 as an input IDT and a bidirectional IDT with split electrodes as an output IDT, wherein the input IDT was placed in an orientation as shown in FIG. 19.

With reference to the description of Japanese Unexamined Patent Publication No. HEI 8(1996)-288780, the wider electrode finger of a split electrode of the unidirectional IDT was $3\lambda/16$ wide and the narrower electrode finger thereof was $\lambda/16$ wide. The electrode period $\lambda$ of the IDT was 15 $\mu$m. The electrodes were made of aluminum films of 0.2 $\mu$m thick. The number of the electrode finger pairs was 95 in each of the input and output IDT.

In FIGS. 18 and 19, the reference signs "6" and "8" indicate the direction from the wider electrode finger toward the narrower electrode finger, and the reference sign "7" indicates a direction in which the SAW excited by the unidirectional IDT propagates toward the receiver IDT.

FIG. 20 shows a filter characteristic of this filter. There exists a great ripple around the center frequency (209 MHz to 210 MHz). In the case of the 36° Y-X: quartz substrate, the construction of FIG. 19 does not bring a good filter characteristic. Further, the width of the wider electrode of the unidirectional IDT shown in FIG. 18 was varied for seeking a better filter characteristic, but a good filter characteristic without ripples is not obtained.

Thus, in the case of the 36° Y-X: quartz substrate, there is a problem in that a great ripple appears around the center frequency when the unidirectional IDT is placed in the orientation shown in FIG. 19. In other words, the problem was that good filters cannot be produced even by placing the unidirectional IDT in the orientation shown in FIG. 19 by reference to the directivity described in Japanese Unexamined Patent Publication Nos. SHO 61(1986)-6917 and HEI 8(1996)-288780, depending on materials for the substrate.

SUMMARY OF THE INVENTION

The present invention provides a surface acoustic wave device for exciting a surface acoustic wave which comprises a piezoelectric substrate and a plurality of interdigital transducers for sending and receiving surface acoustic waves mounted on a surface of the piezoelectric substrate, wherein at least one of the interdigital transducers includes a positive electrode including a plurality of positive split electrodes and a negative electrode including a plurality of negative split electrodes, the positive and negative split electrodes being arranged alternately and each of the positive and negative split electrodes having a pair of electrode fingers, two electrode fingers of each of the positive and negative split electrodes are different in width in a direction in which the surface acoustic wave is excited, and an angle α determined by a direction transverse to the electrode fingers from one of the two electrode fingers having a smaller reflection factor toward the other one of the two electrode fingers having a larger reflection factor and a direction in which the surface acoustic wave excited by the interdigital transducer including the split electrodes travels to one of the interdigital transducers for receiving the surface acoustic wave is equal to or larger than 0° and smaller than 90°, i.e., 0≦α<90.

The present invention further provides a surface acoustic wave device for exciting a surface acoustic wave which comprises a piezoelectric substrate and a plurality of interdigital transducers for sending and receiving surface acoustic waves mounted on a surface of the piezoelectric substrate, wherein at least one of the interdigital transducers includes a positive electrode including a plurality of positive split electrodes and a negative electrode including a plurality of negative split electrode, the positive and negative split electrodes being arranged alternately and each of the positive and negative split electrodes having a pair of electrode fingers, two electrode fingers of each of the positive and negative split electrodes are different in width in a direction in which the surface acoustic wave is excited, and an angle α determined by a direction transverse to the electrode fingers from one of the two electrode fingers having a smaller width toward the other one of the two electrode fingers having a larger width and a direction in which the surface acoustic wave excited by the interdigital transducer including the split electrodes travels to one of the interdigital transducers for receiving the surface acoustic wave is equal to or larger than 0° and smaller than 90°, i.e., 0≦α<90.

DESCRIPTION OF THE PREFERRED EMBODIMENTS

According to the present invention, a SAW device can be provided which has the aforesaid construction and thereby has a good frequency characteristic of low loss and without ripples.

As the piezoelectric substrate, a substrate of rotated Y-X: quartz, especially 36° Y-X quartz, X- 112° Y: $LiTaO_3$ or 45° X-Z: $Li_2B_4O_7$ may preferably be used for providing low-loss good characteristics without ripples.

Figure 1:
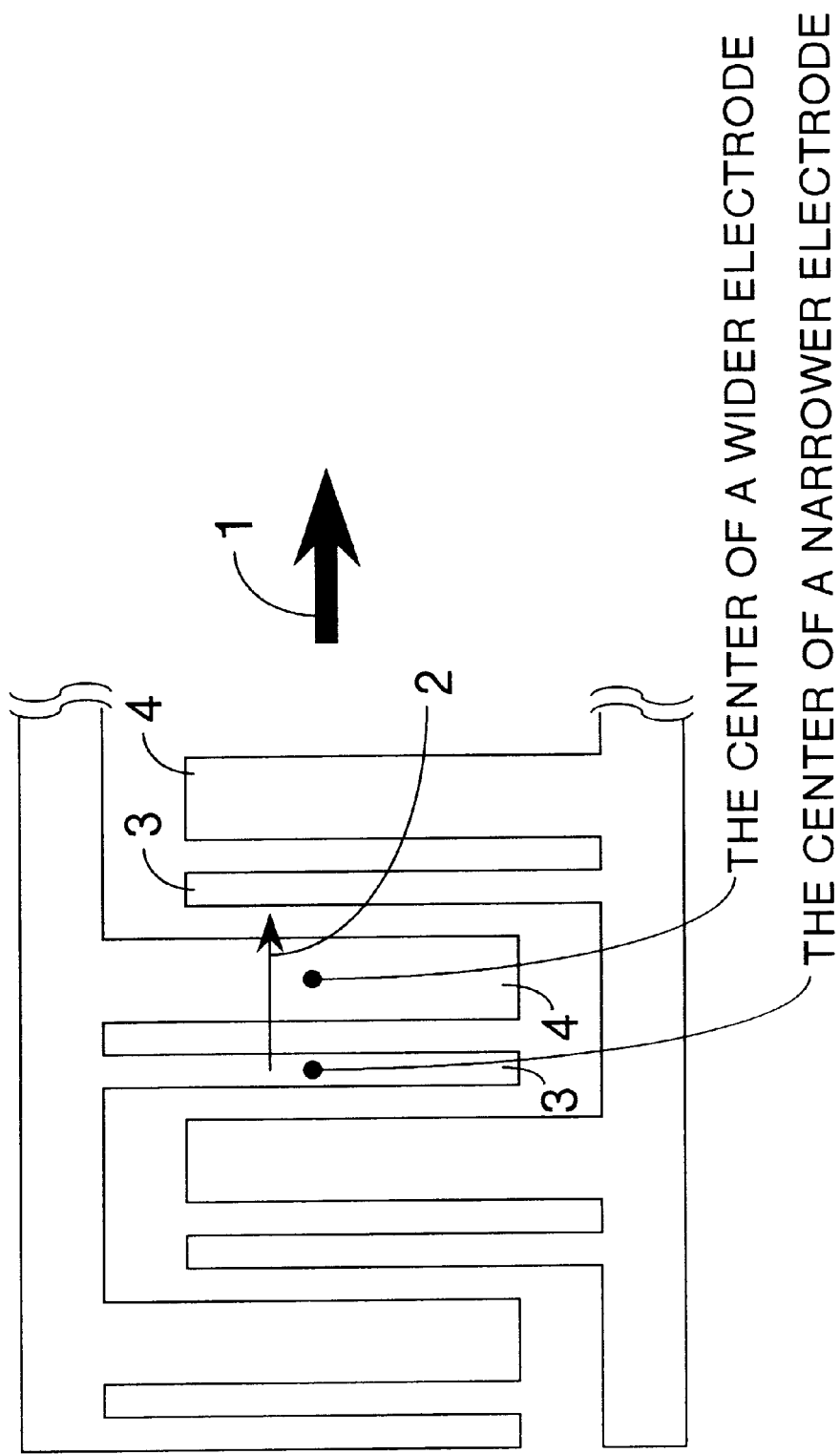
FIG. 1 is a schematic view illustrating the principle of a SAW device in accordance with the present invention.

FIG. 1 is a schematic view illustrating the principle of a SAW device in accordance with the present invention. FIG. 1 shows a part of a unidirectional IDT having positive split electrodes and negative split electrodes each having a pair of electrode fingers 3 and 4 different in width. The positive and negative split electrodes are alternately arranged.

In this unidirectional IDT, the split electrodes extending downward and the split electrodes extending upward in the figure are alternately disposed in a direction transverse to the electrode fingers, thereby forming a so-called interdigital structure.

In general, SAW devices such as SAW filters are composed of a plurality of IDTs formed on the piezoelectric substrate.

In the SAW device of the present invention, at least one of the plural IDTs is formed as the above-described unidirectional IDT on the piezoelectric substrate.

Further, at least one of the IDTs is an input IDT for inputting an electric signal from the outside and at least one is an output IDT for outputting anelectric signal to the outside. The SAW excited by such IDTs is propagated from one IDT to another IDT. An IDT from which the SAW is propagated is referred to as a sender IDT and an IDT to which the SAW is propagated is referred to as a receiver IDT. Though not shown in FIG. 1, there is assumed to be a receiver IDT to the right of the unidirectional IDT in FIG. 1.

The SAW, excited by the IDT, travels in an area where the positive and negative electrode finger pairs exist alternately, in a direction transverse to the electrode finger (i.e., in the right-to-left or left-to-right direction in the figure). The unidirectional IDTs, in particular, are so constructed that most SAWs propagate in either of the directions transverse to the electrode fingers.

In order to excite the SAW propagating in one direction, the present invention is characterized in that the split electrodes of the unidirectional IDT are arranged as shown in FIG. 1.

More particularly, a direction 2 transverse to the electrode fingers from the narrower electrode finger 3 of the two electrode fingers composing the electrode finger pair of the split electrode to the wider electrode finger 4 thereof conforms with a propagation direction 1 in which the SAWs are to propagate toward the receiver IDT.

In the electrode finger pairs of the split electrodes of the unidirectional IDT in FIG. 1, the narrower electrode fingers are disposed on the left in the figure, i.e., on the side from which the SAW is to propagate. The wider electrode fingers are spaced to the right of the narrower electrode fingers (on the side to which the SAW is to propagate).

Here, the aforesaid direction 2 is a direction from the center of the narrower electrode finger 3 toward the center of the wider electrode finger 4.

An arrow indicated by the reference numeral 1 in the figure represents the direction in which the SAW excited by the unidirectional IDT is to propagate toward the receiver IDT. The direction is from left to right in the figure.

Compared with the aforementioned unidirectional IDTs disclosed by Japanese Unexamined Patent Publication Nos. SHO 61(1986)-6917 and HEI 8(1996)-288780, the present invention is different in that the two electrode fingers of the split electrode are disposed in an opposite order. More particularly, in the conventional unidirectional IDTs, the direction from the wider electrode finger toward the narrower electrode finger conforms with the direction in which the SAW proceeds to the receiver IDT, while in the present invention the direction is quite opposite.

According to the present invention, by thus setting the two directions (1 and 2 in FIG. 1), it has become possible to provide a low-loss SAW device having a good frequency characteristic free from ripples as described below. Such a SAW filter has not been known.

Figure 19:
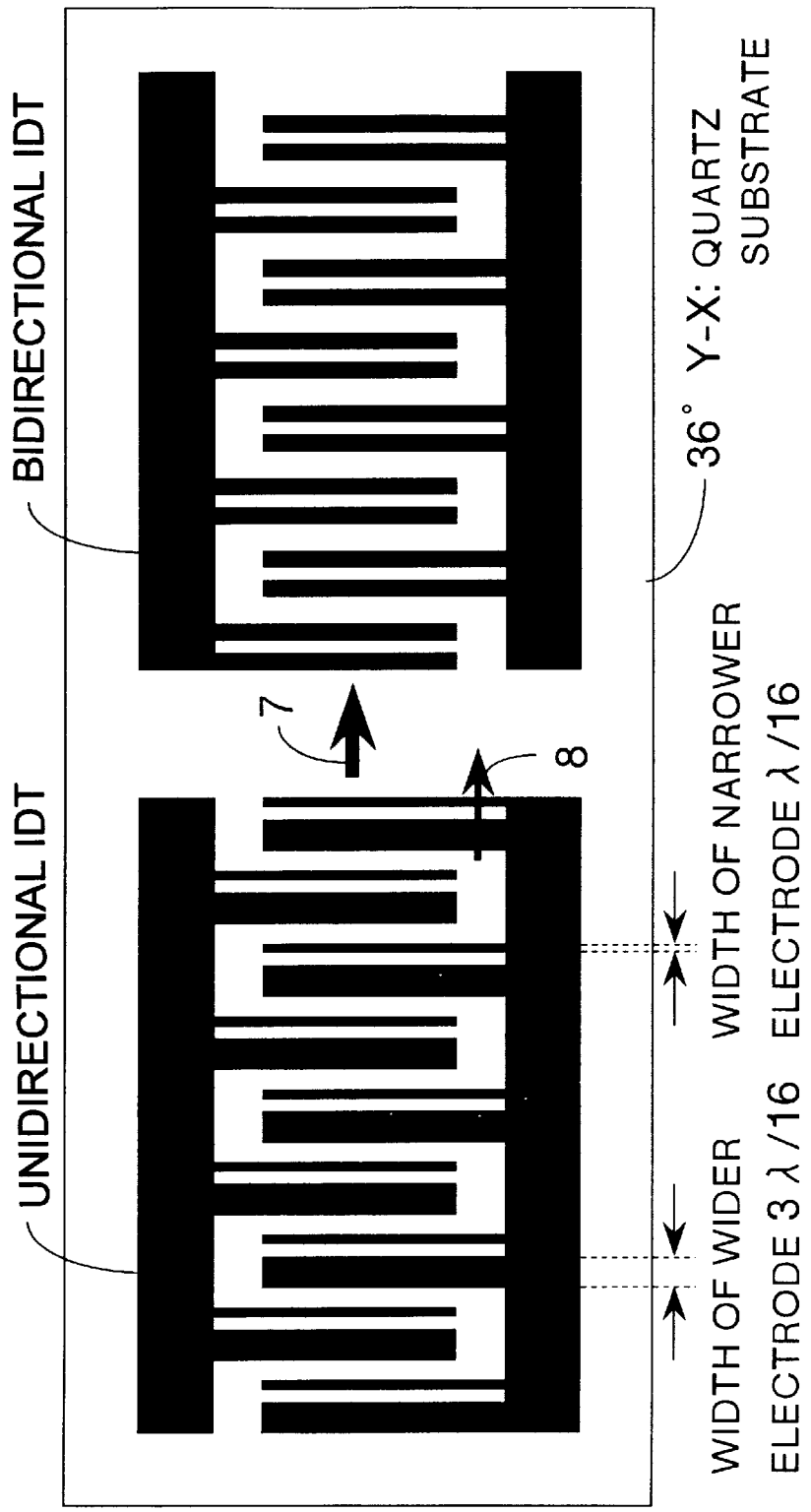
FIG. 19 is a schematic view illustrating a conventional construction of a SAW filter composed of a conventional unidirectional IDT and bidirectional IDT.
Figure 20:
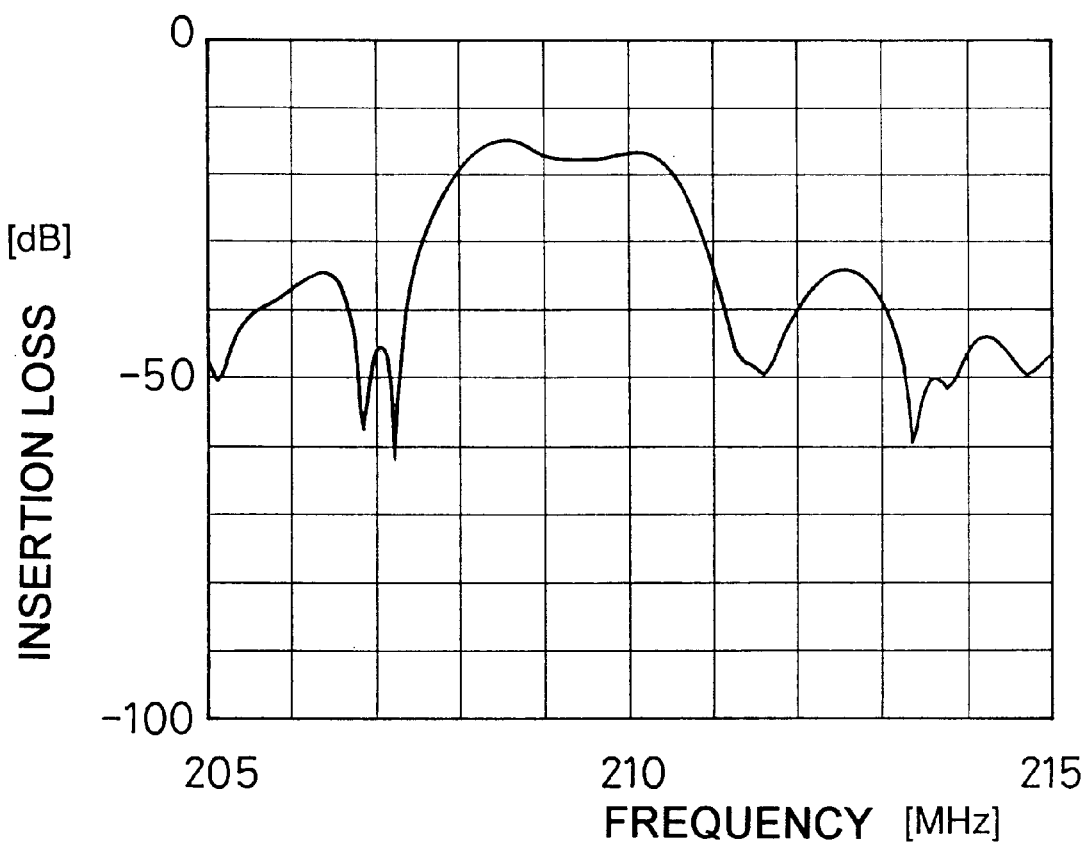
FIG. 20 shows the filter characteristic of the SAW filter shown in FIG. 19 using 36° Y-X: quartz.

Though the receiver IDT is not shown in FIG. 1, the above-described two directions (1 and 2 in FIG. 1) agree with each other if the receiver IDT is located to the right of the unidirectional IDT shown in FIG. 1 in such a manner that a portion of the receiver IDT where the positive and negative split electrodes are alternately disposed is aligned in the lateral direction in the figure with a portion of the unidirectional IDT in FIG. 1 where the positive and negative split electrodes are alternately disposed. In this case, the receiver IDT is located in a position similar to the position of the bidirectional IDT in FIG. 19.

Figure 2:
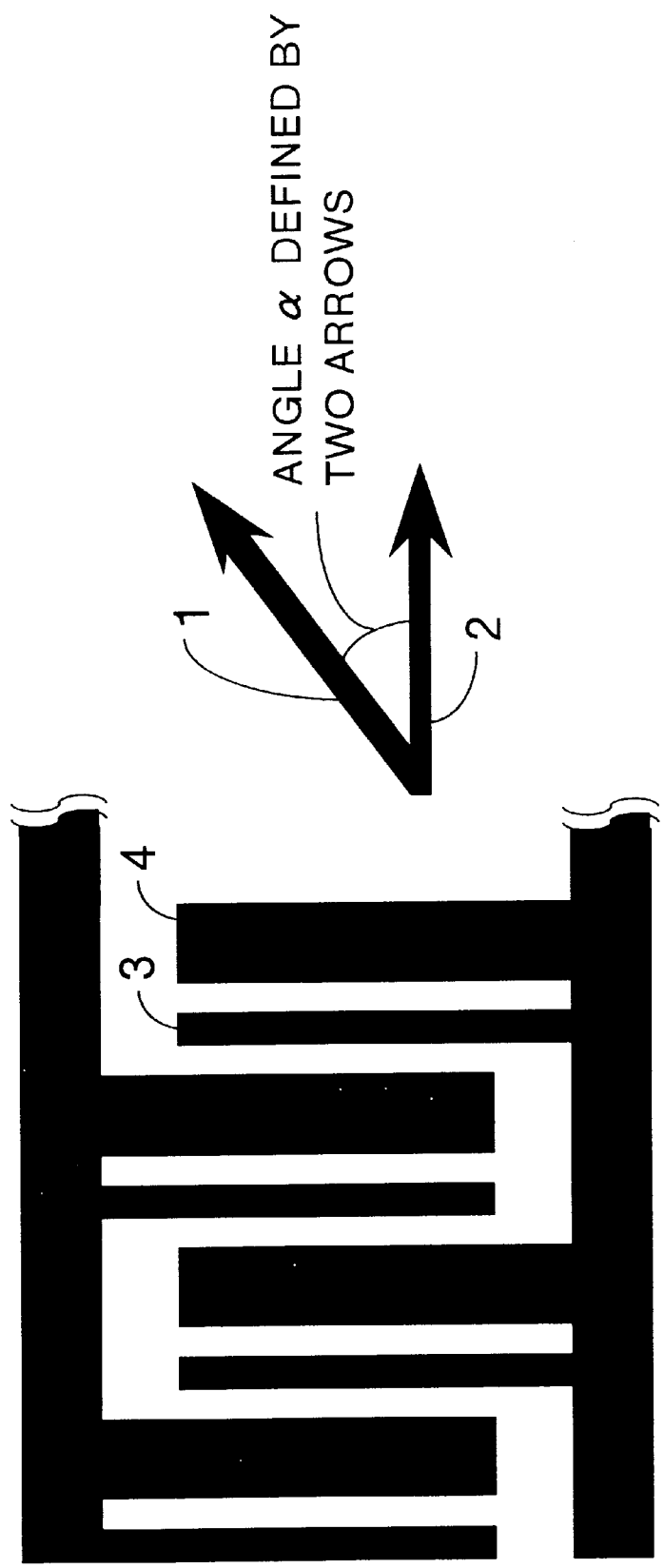
FIG. 2 is a schematic view illustrating the case where a direction in which a SAW excited by a unidirectional IDT propagates toward a receiver IDT does not coincide with a direction from a narrower electrode finger of an electrode finger pair of a split electrode to a wider electrode finger thereof in a SAW device in accordance with the present invention.

FIG. 2 is a schematic view illustrating the case where the direction 1 in which the SAW excited by the unidirectional IDT is to proceed toward the receiver IDT does not completely coincide with the direction 2 from the narrower electrode finger to the wider electrode finger in each electrode finger pair.

More particularly, in FIG. 2, the receiver IDT is located in a position upwardly off the direction from the narrower electrode finger toward the wider electrode finger (i.e., the horizontal direction in the figure) In this case, the unidirectional IDT and the receiver IDT are so located that an angle $\alpha$ determined by the arrows 1 and 2 is smaller than 90° ($0 \leq \alpha < 90°$) Here, the angle $\alpha$ determined by the two arrows means an angle smaller than 180°. Also with this construction, the SAW device can be provided with good frequency characteristics just as with the construction shown in FIG. 1.

FIGS. 3 to 7 are schematic views illustrating the construction of several embodiments of SAW filters using the unidirectional IDT shown in FIG. 1 or 2. In these embodiments, rotated Y-X: quartz, X- 112° Y: LiTaO$_3$ or 45° X-Z: Li$_2$B$_4$O$_7$ is used as the piezoelectric substrate.

Figure 3:
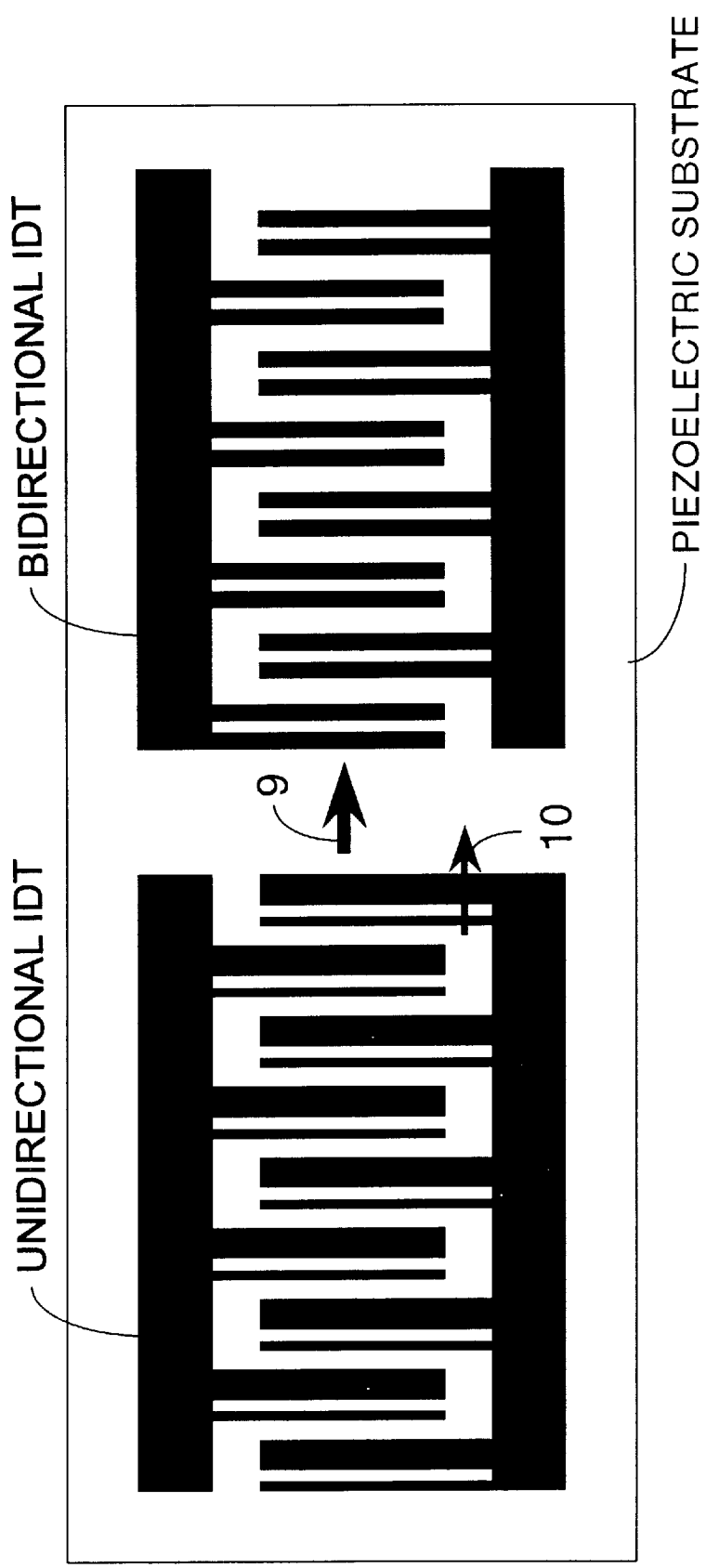
FIG. 3 is a schematic view illustrating the construction of a SAW filter in which the unidirectional IDT of the present invention and a bidirectional IDT are placed oppositely in accordance with an embodiment of the present invention.

FIG. 3 is a schematic view illustrating the construction of a SAW filter in which the unidirectional IDT of the present invention and a generally used bidirectional IDT are placed oppositely.

If the unidirectional IDT and the bidirectional IDT are used as an input IDT (i.e., the sender IDT) and as an output IDT (i.e., the receiver IDT), respectively, the SAW excited by the unidirectional IDT should head toward the receiver bidirectional IDT in the direction from left to right as indicated by an arrow 9 in the figure. This direction is conformed with a direction 10 from the narrower electrode finger to the wider electrode finger of each electrode finger pair of the unidirectional IDT.

Additionally, in the case where the center of the unidirectional IDT is shifted in an up-and-down direction in the figure with respect to the center of the bidirectional IDT and thereby the directions indicated by the arrows 9 and 10 do not coincide with each other, the device may be so constructed that the angle determined by the two arrows is smaller than 90°.

Figure 4:
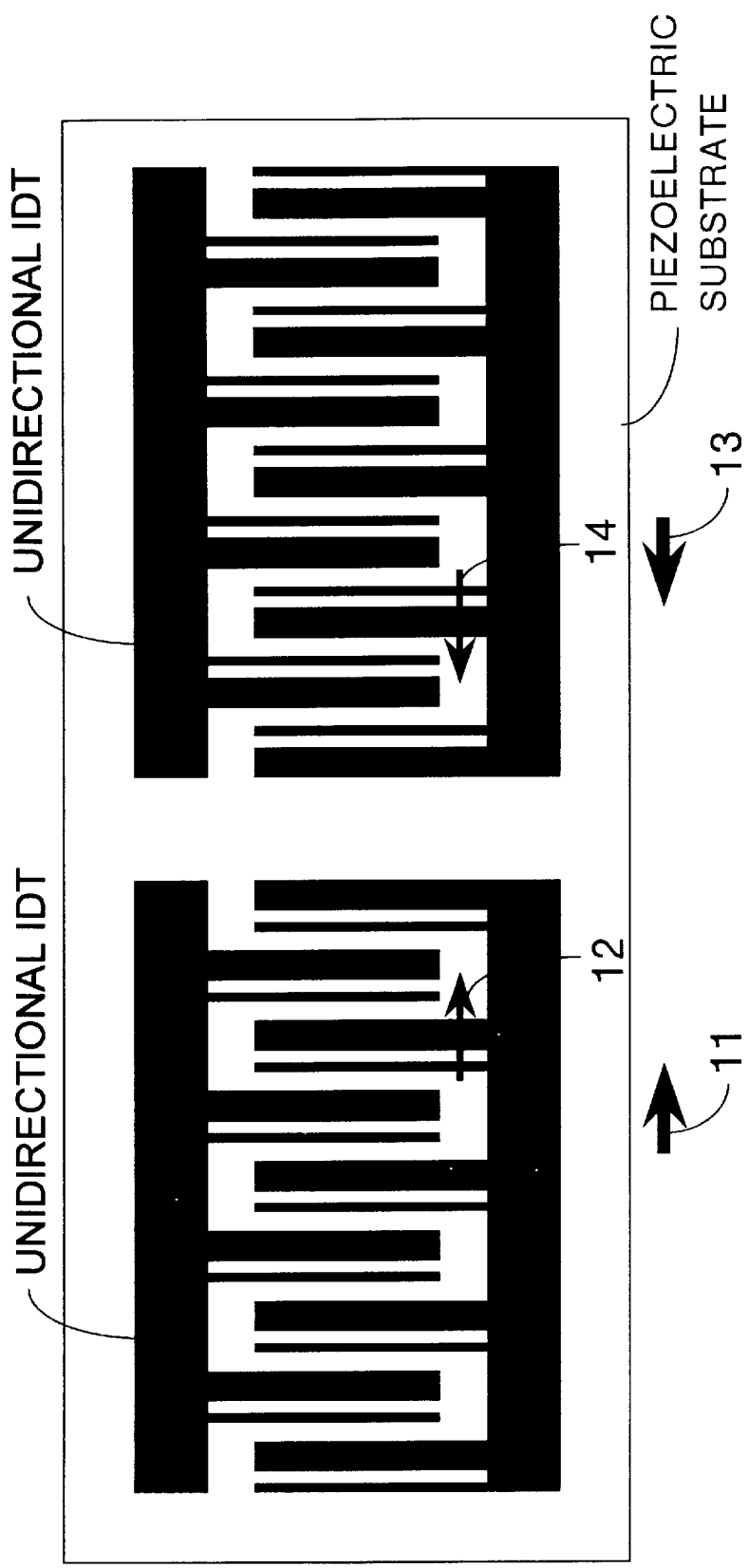
FIG. 4 is a schematic view illustrating the construction of a SAW filter in which two unidirectional IDTs of the present invention are placed oppositely in accordance with an embodiment of the present invention.

FIG. 4 is a schematic view illustrating the construction of a SAW filter in which two of the unidirectional IDTs are placed oppositely on a piezoelectric substrate. If the unidirectional IDT on the left is for inputting (a sender IDT) and that on the right is for outputting (a receiver IDT), the direction in which the SAW excited by the unidirectional IDT on the left propagates toward the unidirectional IDT on the right is from left to right as indicated by an arrow 11 in the figure. The direction from the narrower electrode finger toward the wider electrode finger of the electrode finger pair in the unidirectional IDT on the left is set from left to right as indicated by an arrow 12 in the figure.

On the other hand, a direction 14 from the narrower electrode finger toward the wider electrode finger of the electrode finger pair in the unidirectional IDT on the right is set from right to left in the figure. This direction 14 coincides with a direction 13 in which, if the unidirectional IDT on the right is an input IDT, the excited SAW heads toward the receiver unidirectional IDT on the left.

Additionally, if the centers of the two unidirectional IDTs are shifted in the up-and-down direction in the figure with respect to each other and thereby the arrow 11 does not coincide with the arrow 12 or the arrow 13 does not coincide with the arrow 14, the device may be so constructed that the angle determined by the two arrows 11 and 12 or 13 and 14 is smaller than 90°.

Figure 5:
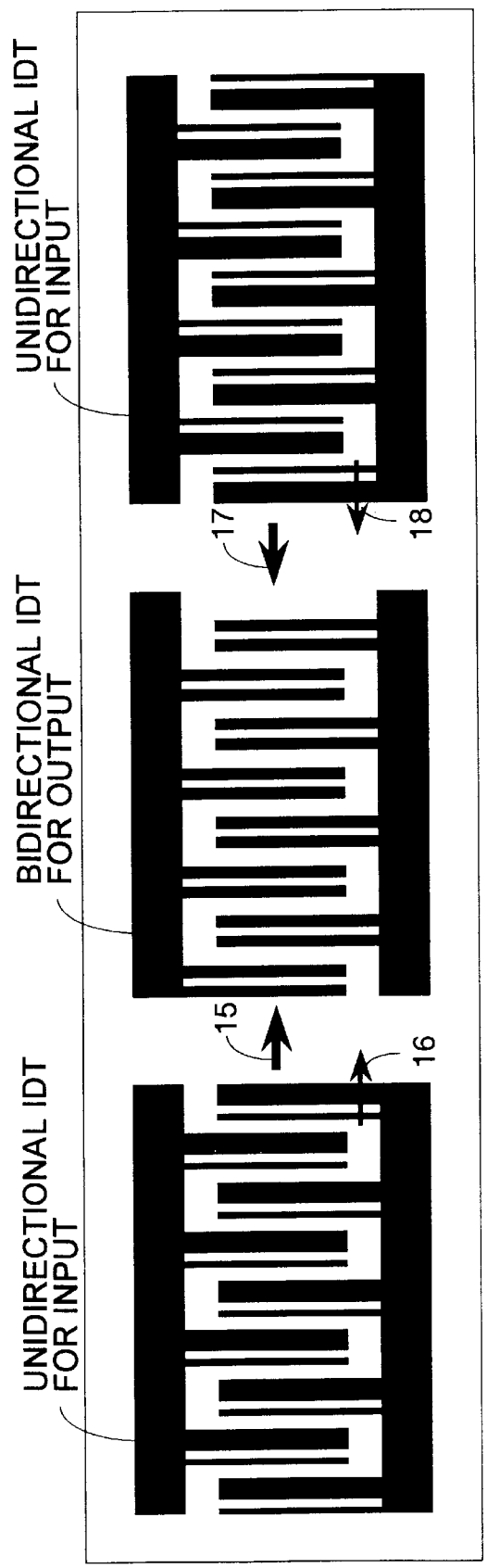
FIG. 5 is a schematic view illustrating the construction of a SAW filter using two unidirectional IDTs of the present invention for input and a bidirectional IDT for output in accordance with an embodiment of the present invention.

FIG. 5 is a schematic view illustrating the construction of a SAW filter in which one bidirectional IDT is located between two of the unidirectional IDTs on a piezoelectric substrate. Here, the two unidirectional IDTs are for input and the bidirectional IDT is for output (a receiver IDT).

From the same viewpoint as concerns the above described FIGS. 3 and 4, the device is so constructed that the direction from the narrower electrode finger to the wider electrode finger of the electrode finger pair in the unidirectional IDT on the left is a direction 16 from left to right in the figure, while the direction in the unidirectional IDT on the right is a direction 18 from right o left in the figure.

Here, the direction 16 conforms with a direction 15 in which the SAW excited by the unidirectional IDT on the left is to propagate toward the receiver IDT, and the direction 18 coincides with a direction 17 in which the SAW excited by the unidirectional IDT on the right is to propagate toward the receiver IDT.

Additionally, if the centers of the two unidirectional IDTs and the center of the bidirectional IDT therebetween are shifted in the up-and-down direction in the figure with respect to each other and thereby the arrow 15 does not coincide with the arrow 16 or the arrow 17 does not coincide with the arrow 18, the device may be so constructed that the angle determined by the two arrows 15 and 16 or 17 and 18 is smaller than 90°.

Figure 6:
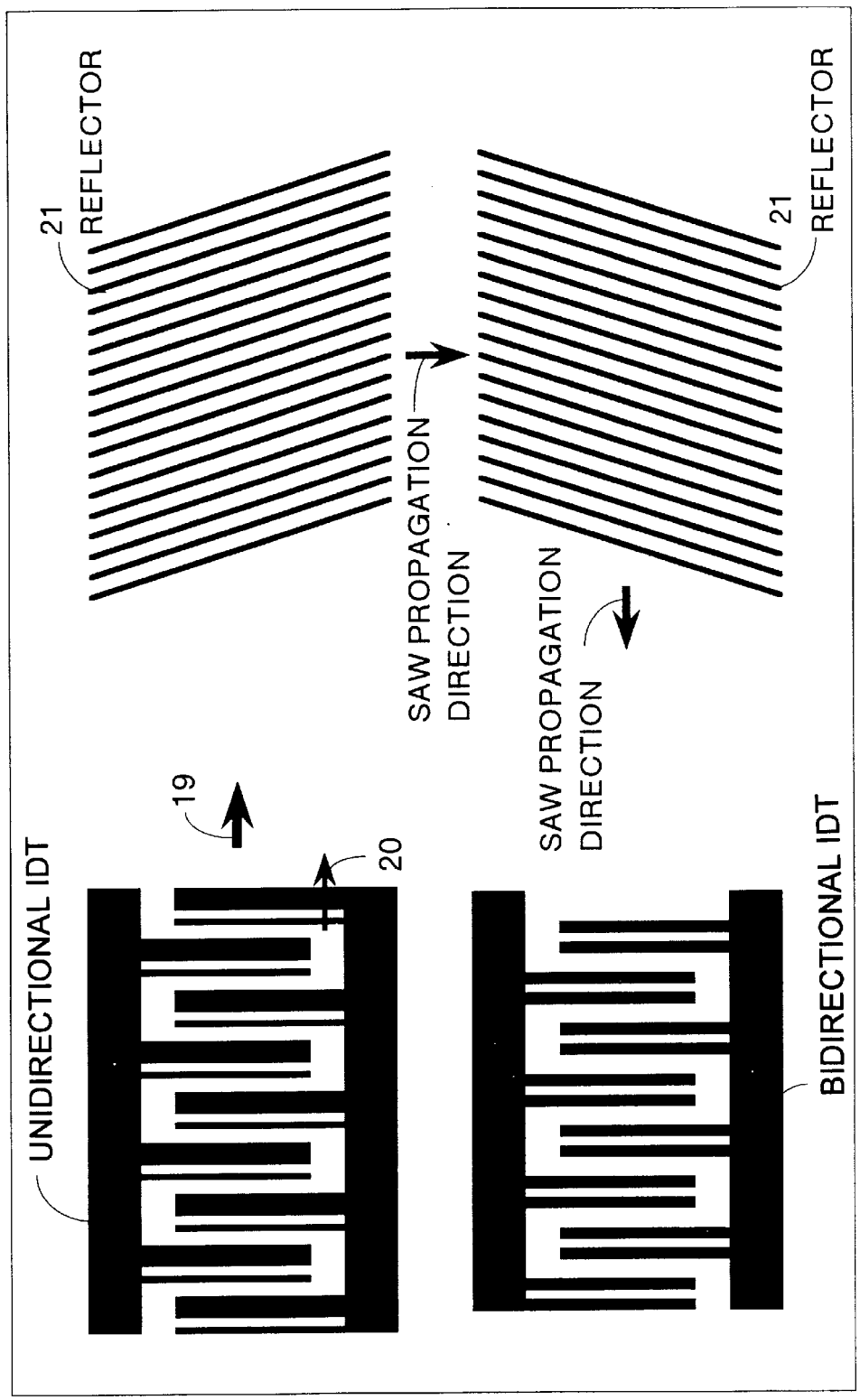
FIG. 6 is a schematic view illustrating the construction of a SAW filter wherein the unidirectional IDT of the present invention is used for input and a SAW excited by the unidirectional IDT is received by a bidirectional IDT for output via two reflectors in accordance with an embodiment of the present invention.

FIG. 6 is a schematic view illustrating the construction of a SAW filter wherein the SAW excited by the unidirectional IDT (a sender IDT) for input located at the upper left in the figure is received by a bidirectional IDT (a receiver IDT) for output at the lower left in the figure via two reflectors 21.

The direction in which the SAW excited by the unidirectional IDT in FIG. 6 is to propagate toward the bidirectional IDT for output is a direction 19 from left to right in the figure. Accordingly, a direction 20 from the narrower electrode finger to the wider electrode finger of the electrode finger pair of the unidirectional IDT is a direction from left to right in the figure, which conforms with the aforesaid direction 19.

The SAW propagating from left to right in the figure is reflected by the two reflectors 21 to change its propagation direction by 180° and propagated to the bidirectional IDT. Reversely, the unidirectional IDT may be used as an IDT for output. In this case, the direction from the narrower electrode finger to the wider electrode finger of the electrode finger pair is set from left to right in the figure.

Additionally, if the center of the unidirectional IDT is shifted in the up-and-down direction in the figure with respect to the centers of the reflectors 21 and thereby the arrows 19 and 20 do not coincide with each other, the device may be so constructed that the angle determined by the arrows 19 and 20 is smaller than 90°.

Figure 7:
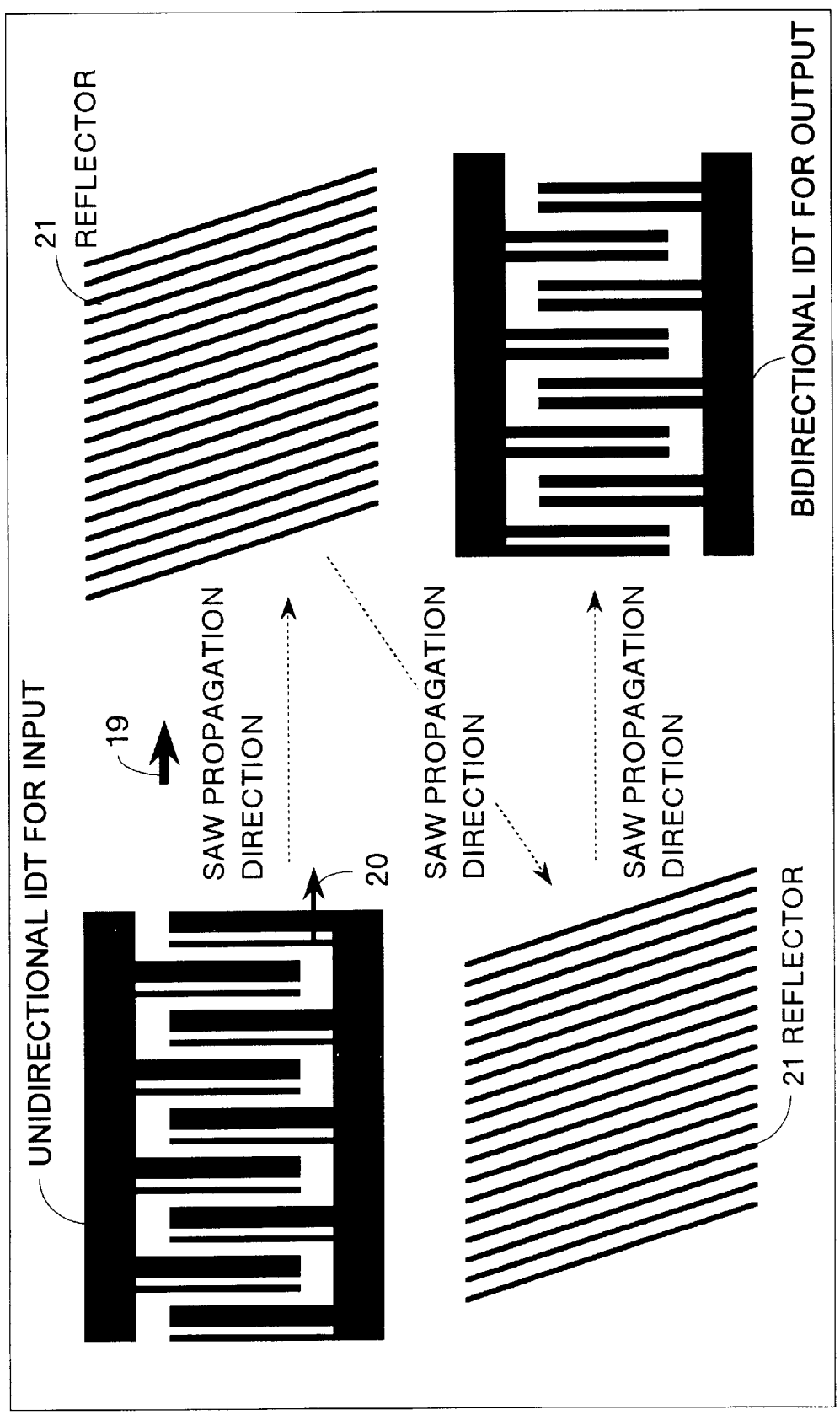
FIG. 7 is a schematic view illustrating a Z pass filter using the unidirectional IDT of the present invention for input in accordance with an embodiment of the present invention.

FIG. 7 is a schematic view illustrating a SAW filter using reflectors 21 which has a structure called Z pass filter. Here, the unidirectional IDT is used for input (a sender IDT), and the bidirectional IDT is used for output (a receiver IDT) In the same consideration as with the case shown in FIG. 6, the direction from the narrower electrode finger to the wider electrode finger of the electrode finger pair of the unidirectional IDT is set to the direction from left to right in the figure, and this direction is conformed with the direction in which the SAW excited by the unidirectional IDT propagates to the receiver IDT.

Reversely, the unidirectional IDT may be used as the output IDT. In this case, the direction from the narrower electrode finger to the wider electrode finger of the electrode finger pair of the unidirectional IDT is set from right to left in the figure.

It is noted that, in the above-described embodiments, the orientation has been explained with the cases where the unidirectional IDT is used as the input IDT, but the unidirectional IDT can also be used as the output IDT. Generally, since the SAW device have reciprocity, its characteristics do not change if input and output are exchanged. Accordingly, in the case where the unidirectional IDT is used as the output IDT, the input IDT and the output IDT may be considered interchangedly for convenience's sake and the arrangement of the electrode fingers of the electrode finger pairs may be determined by considering the direction of the electrode fingers and the direction in which the SAW excited by the unidirectional IDT propagates to the receiver IDT.

Next, it is explained that good filter characteristics can be obtained if the unidirectional IDT of the embodiment shown in FIG. 1 is formed on a piezoelectric substrate of rotated X-Y: quartz, X- 112° Y: LiTaO$_3$ or 45° X-Z: Li$_2$B$_4$O$_7$, First, explanation is given to the principle of directivity of the IDT shown in FIG. 17.

Figure 17:
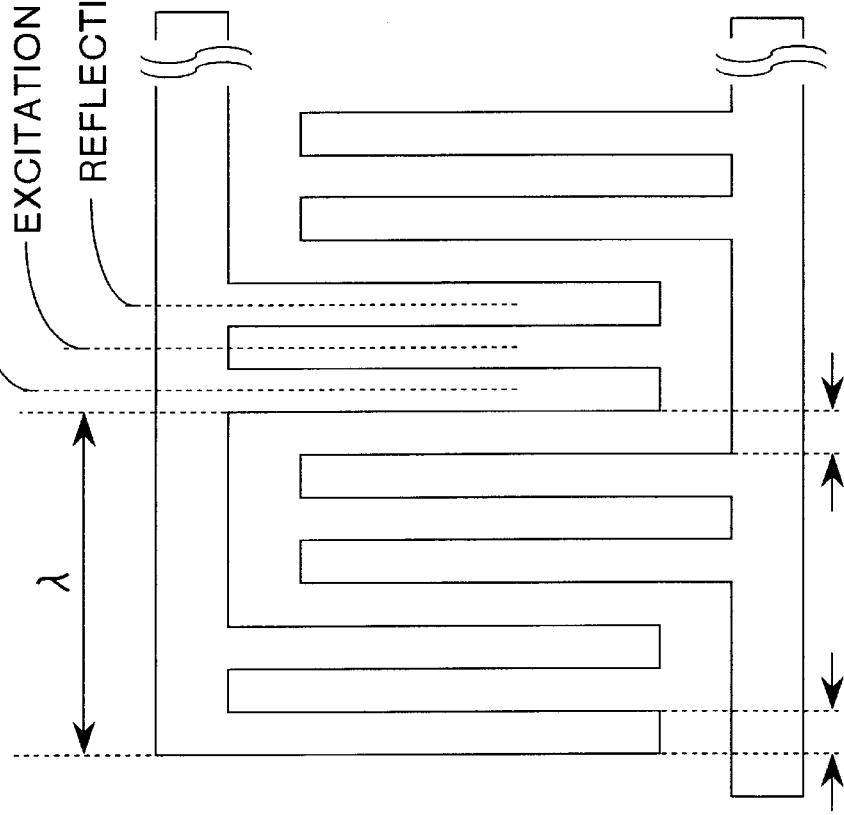
FIG. 17 is a schematic view illustrating the construction of another conventional bidirectional IDT (with split electrodes)

In the case of a bidirectional IDT as shown FIG. 17 in which all the electrode fingers are the same in width and are spaced at an interval of $\lambda/8$, the center of excitation is in the middle of the two electrode fingers, and the centers of reflection are $\lambda/8$ to the right and to the left of the center of excitation.

However, since the centers of reflection exist at positions laterally symmetric with respect to the center of excitation, the centers of reflection offset each other and can be regarded as not existing. Accordingly, the IDT of FIG. 17 does not provide directivity. In this sense, the IDT of FIG. 17 is called bidirectional IDT, and the SAW excited by this IDT is propagated to the right and to the left equally.

Figure 18:
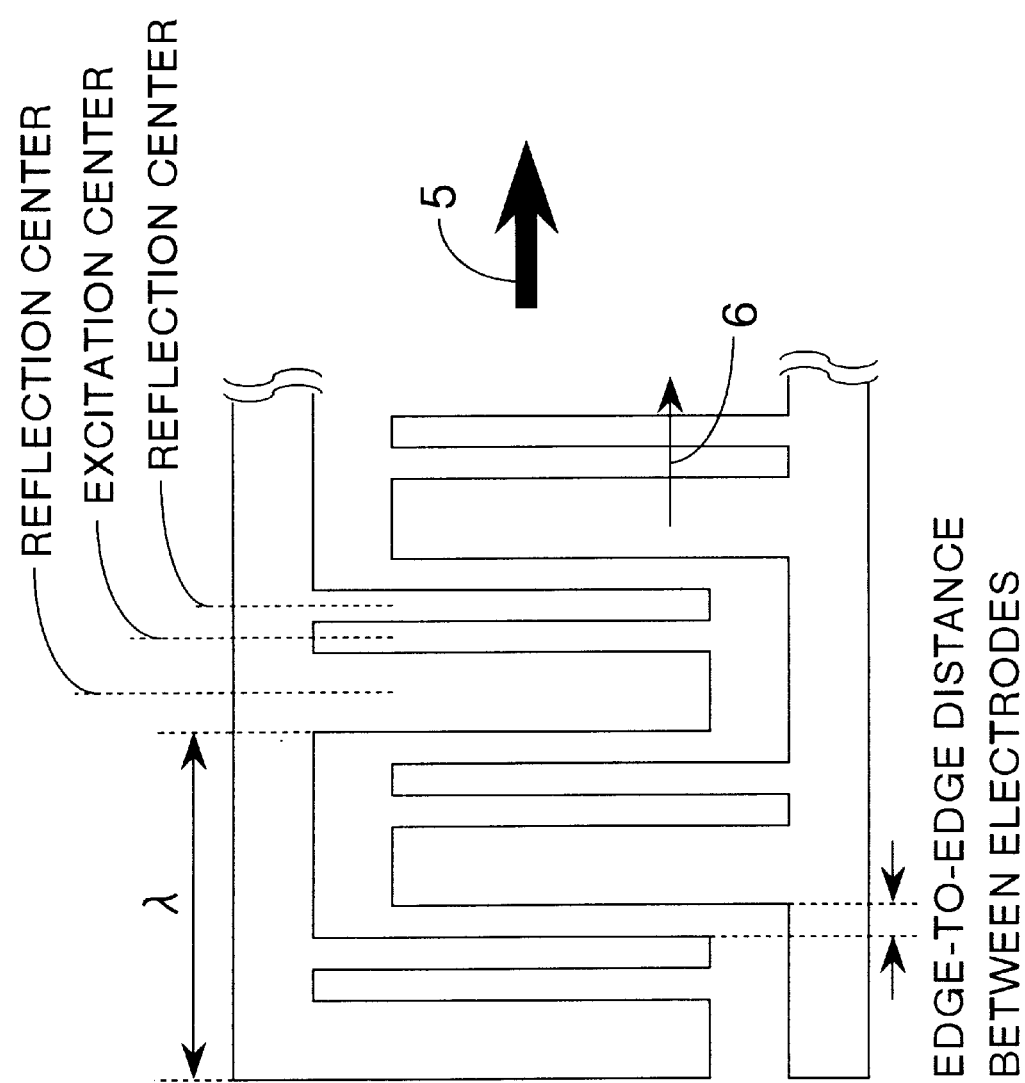
FIG. 18 is a schematic view illustrating the construction of a conventional unidirectional IDT disclosed by Japanese Unexamined Patent Publication No. SHO 61(1986)-6917.

Next, explanation is given to the directivity of the IDT of FIG. 18 as disclosed in Japanese Unexamined Patent Publication No. SHO 61(1986)-6917 in which the electrode finger pair includes two electrode fingers of different widths. The center of excitation is assumed to be approximately in the middle between the centers of the two electrode fingers as in the case of FIG. 17. The centers of reflection are at the centers of the two electrode fingers. However, differently from the case of FIG. 17, since the two electrode fingers have different widths, the electrode fingers have different reflection factors.

Accordingly, two centers of reflection having different reflection factors are to the right and to the left with respect to the center of excitation. Thus, by offset, either of the centers of reflection can be regarded as an apparent center of reflection. As a result, in the case where the two electrode fingers have different widths, the IDT exhibits a directivity for the propagation of the SAW.

In other words, there is a direction in which the SAW tends to propagate, and the direction toward one of the two electrode fingers on which the apparent center of reflection exists (i.e., the electrode finger having the larger reflection factor) is the direction in which the SAW propagates (forward direction).

Then, with regard to the unidirectional IDT shown in FIG. 18, consideration is given as to in which direction the SAW is excited more strongly, in the right direction or the left direction. Referring to FIG. 18, in order that the SAW is excited more strongly in the right direction as indicated by the arrow 5 as disclosed by Japanese Unexamined Patent Publication No. SHO 61(1986)-6917, the apparent center of reflection must be on the narrower electrode finger of the two electrode fingers which is on the right. Accordingly, in FIG. 18, the directivity is shown on the presumption that the narrower electrode finger has a greater reflection factor than the wider electrode finger.

In the present invention, attention is paid to the fact that the reflection factor with respect to the width of an electrode changes depending on materials for the piezoelectric substrate, and it has been considered which of the narrower electrode finger and the wider electrode finger has a greater reflection factor on piezoelectric substrates of different materials. The forward direction in which the SAW is excited strongly in the unidirectional IDT will be now specified explicitly, and the orientation in the arrangement of electrode fingers of the split electrodes will be shown for taking advantage of the unidirectional IDT on various kinds of piezoelectric substrates.

Figure 8:
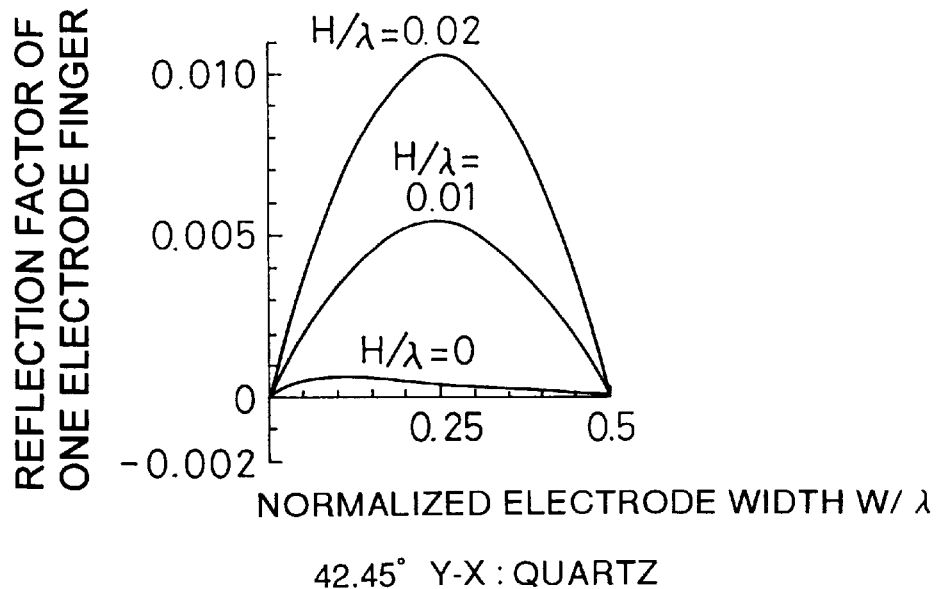
FIG. 8 shows variation in reflection factor of an electrode finger with change in the width thereof in the case of a 42.45° Y-X: quartz substrate.
Figure 9:
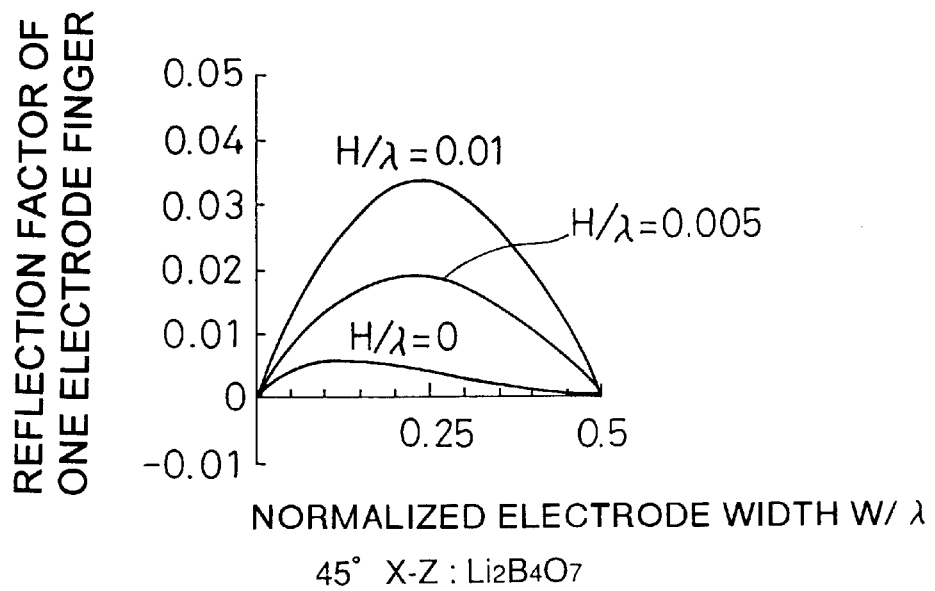
FIG. 9 shows variation in reflection factor of an electrode finger with change in the width thereof in the case of a 45° X-Z: $Li_2B_4O_7$ substrate.
Figure 10:
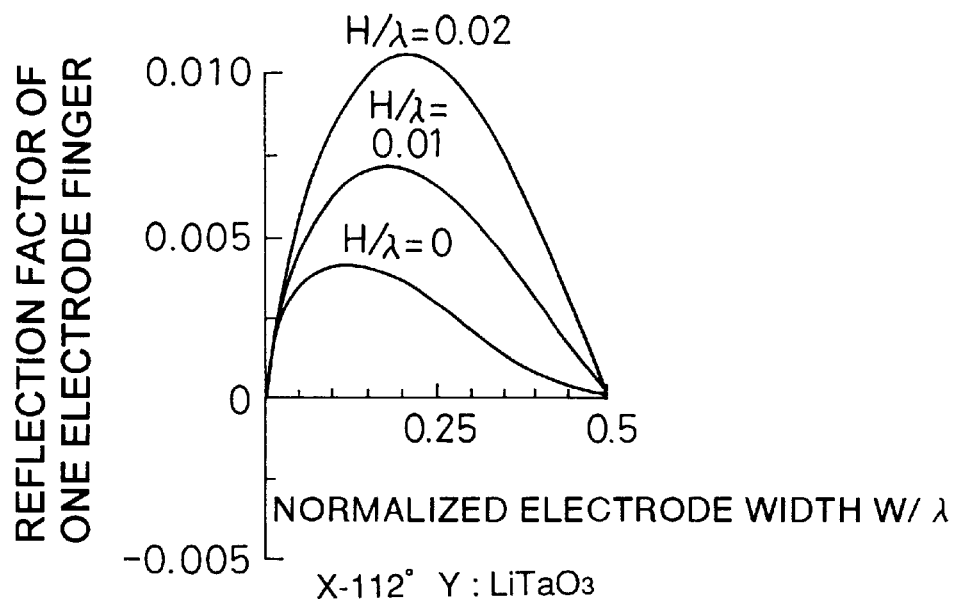
FIG. 10 shows variation in reflection factor of an electrode finger with change in the width thereof in the case of an X- 112° Y: $LiTaO_3$ substrate.

First, FIGS. 8, 9 and 10 are graphs showing change in the reflection factor of one electrode finger with change in the width of the electrode finger on piezoelectric substrates of different materials. These graphs are from "Handbook of Surface Acoustic Wave Technology" edited by the one-hundred and fifty Committee on Surface Acoustic Wave Device Technology in the Japan Society for the Promotion of Science published on Nov. 30, 1991.

In the case of 42.45° Y-X quartz in FIG. 8, the reflection factor of the electrode finger is found to become larger as the electrode finger becomes wider, until a normalized electrode width (w/λ: w is the width of the electrode finger, λ is the electrode period) reaches 0.25 (equivalent to λ/4). The sum of the width of the wider electrode finger and that of the narrower electrode finger must be less than λ/2 (normalized electrode width of 0.5). Accordingly, if the unidirectional IDT of FIG. 1 is made using 42.45° Y-X quartz, the center of reflection exists on the wider electrode finger which has a larger reflection factor and therefore the SAW is excited strongly to the right in the figure. Thus, the IDT exhibits the forward directivity.

Accordingly, by arranging IDTs as shown in FIG. 3, good filter characteristics of low-loss without ripples can be obtained because the SAW excited in the forward direction is received by the receiver IDT.

In other words, if the unidirectional IDT is so constructed that the direction transverse to the electrode fingers from the electrode finger having a smaller reflection factor (the narrower electrode finger) to the electrode finger having a larger reflection factor (the wider electrode finger) is substantially conformed with the direction in which the SAW excited by the unidirectional IDT travels to the receiver IDT, it is possible to obtain a SAW filter having a good low-loss filter which is free from ripples.

Additionally, FIG. 8 shows that, when the normalized electrode width exceeds 0.25, the reflection factor decreases as the electrode width becomes larger. The narrower electrode finger seems to have a larger reflection factor within the right half region of FIG. 8. However, that will be practically difficult because there is the requirement that the sum of the widths of the two electrode fingers should be smaller than λ/2.

In the case of 45° X-Z: $Li_2B_4O_7$ of FIG. 9, the reflection factor of one electrode finger with respect to the normalized electrode width becomes larger as the electrode finger becomes wider until the normalized electrode width reaches 0.25, similarly to the case of 42.45° Y-X: quartz of FIG. 8. Accordingly, by the arrangement shown in FIGS. 1 and 3, the SAW excited in the forward direction is received by the receiver IDT, and thus, good filter characteristics of low loss can be obtained.

In the case of X- 112° Y: $LiTaO_3$ of FIG. 10, provided that the electrode thickness (H)/the electrode period (λ) is larger than 0.01, the reflection factor increases as the electrode width becomes larger until the normalized electrode width W/λ reaches about 0.2. Accordingly, as in the cases of 42.45° Y-X: quartz and 45° X-Z: $Li_2B_4O_7$, by arranging the unidirectional IDT as shown in FIGS. 1 and 3, good filter characteristics of low loss can be obtained because the SAW excited in the forward direction is received by the receiver IDT.

As discussed above, the wider electrode finger of the split electrode of the unidirectional IDT has a larger reflection factor than the narrower electrode finger on the piezoelectric substrate of 42.45° Y-X: quartz, 45° X-Z: $Li_2B_4O_7$ and X- 112° Y: $LiTaO_3$.

On any piezoelectric substrate, however, provided that H/λ is equal to 0 (H/λ=0), the reflection factor becomes the maximum when the normalized electrode width is about λ/8 (w/λ=0.125). That is, the narrower electrode finger has a greater reflection factor than the wider electrode finger, and the SAW is excited strongly in the direction disclosed by the Japanese Unexamined Patent Publication No. SHO 61(1986)-6917.

However, if H/λ is increased only a litter from 0 to 0.01, for example, the electrode width that provides the maximum reflection factor increases greatly to about λ/5–λ/4 (normalized electrode width w/λ=0.2 to 0.25). Further, at H/λ=0, since the reflection factor varies only a little with respect to change in the width of the electrode finger, it is difficult to produce a unidirectional IDT having a large directivity. Therefore, the case of H/λ=0 is not taken into consideration. The above discussion shows that good characteristics in the forward direction can be obtained by arranging the unidirectional IDT in the orientation shown in FIG. 1, in the case of any piezoelectric substrate of 42.45° Y-X: quartz, 45° X-Z: $Li_2B_4O_7$ or X- 112° Y: $LiTaO_3$.

As for the change in the reflection factor with change of the electrode width on substrates of quartz, it is reported that the reflection factor changes on 38° Y-X: quartz [1] and on 34° Y-X: quartz [2] in the same manner as the reflection factor on 42.45° Y-X: quartz. Accordingly, as to quartz substrates, in the case where a rotated Y cut quartz is used, besides 42.45° Y-X: quartz, good characteristics in the forward direction can be obtained by arranging the unidirectional IDT in the orientation shown in FIG. 1.

Figure 11:
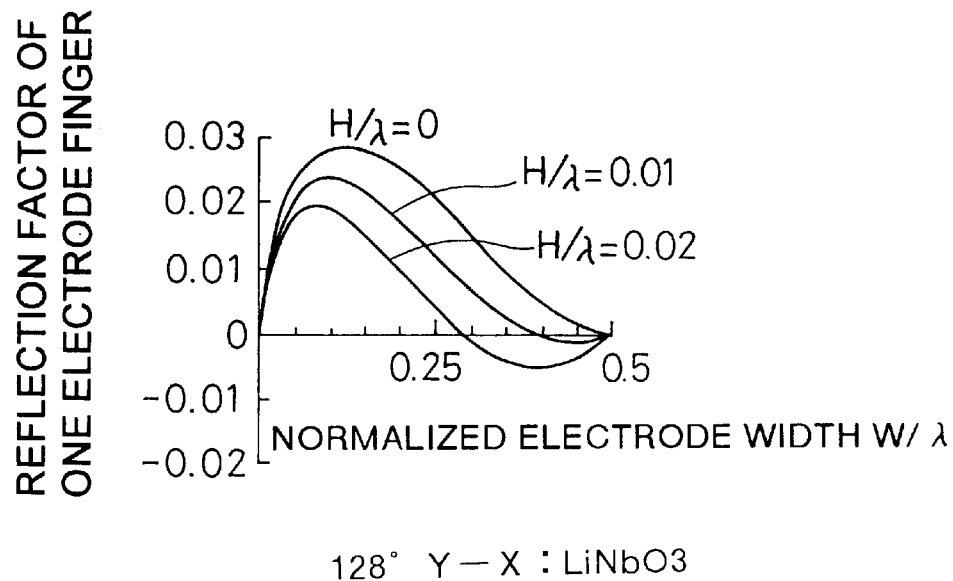
FIG. 11 shows variation in reflection factor of an electrode finger with change in the width thereof in the case of a 128° Y-X: $LiNbO_3$ substrate.

For reference, FIG. 11 shows change in the reflection factor of one electrode with change in the electrode width in the case of a substrate of 128° Y-X: $LiNbO_3$.

In this case, the electrode width which provides the maximum reflection factor is about λ/8 (normalized electrode width w/λ=0.125) or smaller regardless of the thickness of the electrode. In the unidirectional IDT shown in FIG. 18, the narrower electrode finger has a larger reflection factor. Accordingly, the SAW is excited more strongly in the direction from the wider electrode finger to the narrower electrode finger, that is, in the direction to the right in the figure, as disclosed by Japanese Unexamined Patent Publication No. SHO 61(1986)-6917.

This discussion reveals that, in the unidirectional IDT in FIG. 18, the forward direction in which the SAW is strongly excited changes depending on substrates. The forward direction is to the right in the figure in the case of 128° Y-X: LiNbO$_3$ and is to the left in the case of rotated Y-X quartz, 45° Y-X: Li$_2$B$_4$O$_7$ and X- 112° Y: LiTaO$_3$.

The present invention has been explained with piezoelectric substrates of rotated Y-X quartz, 45° Y-X Li$_2$B$_4$O$_7$ or X- 112° Y: LiTaO$_3$ so far, but the piezoelectric substrate is not limited thereto. The piezoelectric substrate may be made of any material that allows the reflection factor of the electrode finger to change with change in the electrode width in substantially the same manner as shown in the graph of FIGS. 8, 9 or 10.

Further, the mode of the SAW is not necessarily limited to Rayleigh wave, but may be any mode such as leaky surface acoustic wave, surface skimming bulk wave or surface transverse wave.

EXAMPLE

Now explained is a SAW filter having the construction shown in FIG. 3 using a 36° Y-X substrate. The narrower electrode finger of the unidirectional IDT is λ/8 wide, and the wider one is λ/5 wide. λ is electrode period and equals 15 μm. The thickness H of the electrodes is 0.19 μm, and the number of electrode finger pairs is 95 in each of the unidirectional IDT and the bidirectional IDT.

Further, as shown in FIG. 3, the split electrodes are so arranged that the propagation direction 9 in which the SAW excited by the unidirectional IDT propagates is conformed with the direction 10 from the narrower electrode to the wider electrode of the electrode finger pair.

Figure 12A:
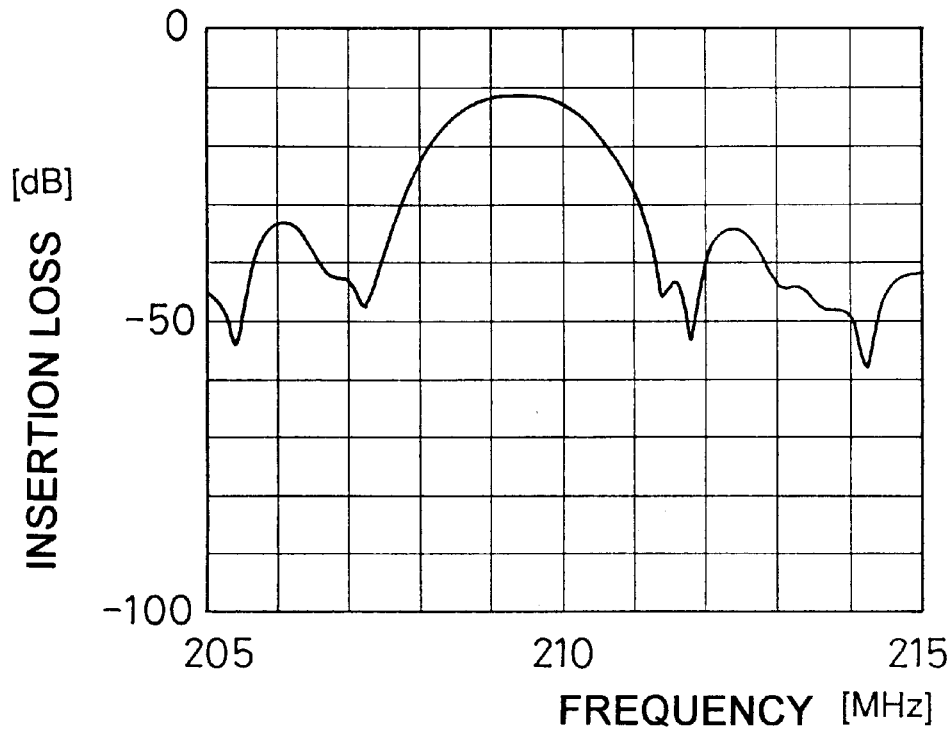
FIG. 12A shows a filter characteristic of a SAW filter in accordance with the present invention when the width of the wider electrode finger is λ/5.
Figure 12B:
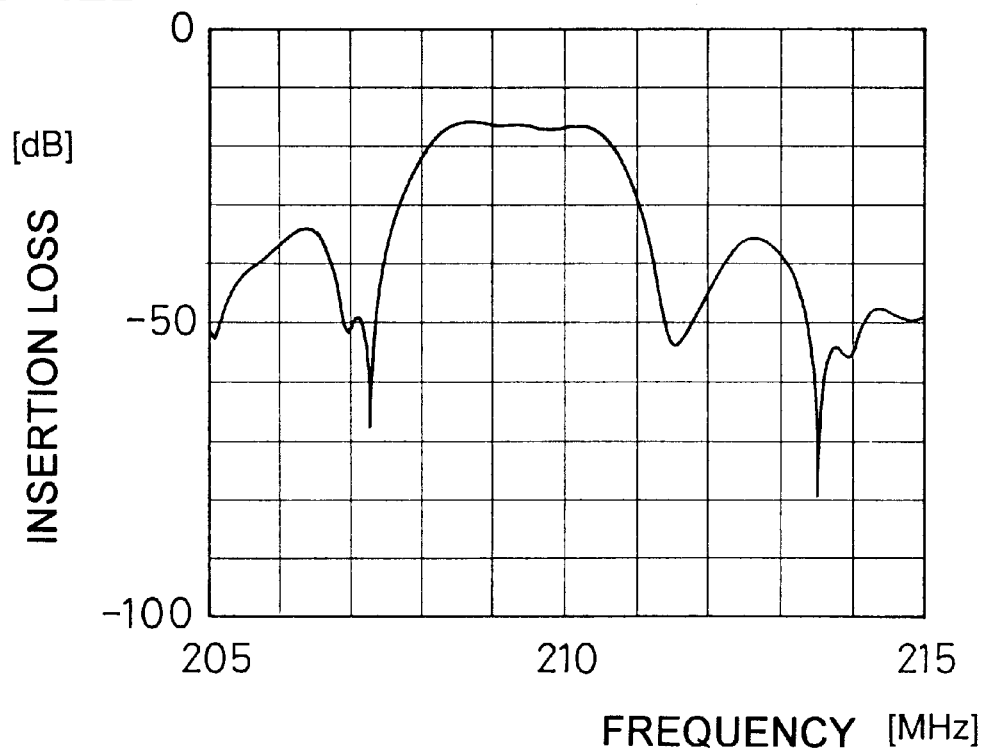
FIG. 12B shows the filter characteristic of a conventional SAW filter when the width of the wider electrode finger is λ/5.

FIG. 12A shows the frequency characteristic of this SAW filter. For comparison, FIG. 12B shows the frequency characteristics of a SAW filter in which, as in FIG. 19, the electrode fingers of the split electrodes of the unidirectional IDT are arranged reversely left to right to the arrangement shown in FIG. 3.

Comparing the figures reveals that ripples are not seen and loss is smaller, in FIG. 12A. Around 210 MHz, loss in FIG. 12A is about −11.6 dB, while loss in FIG. 12B is about −16.6 dB. A ripple is seen around 210 MHz in FIG. 12B, while no ripples are seen in FIG. 12A. These results show that a filter of good frequency characteristic can be obtained by arranging the unidirectional IDT in the orientation shown in FIG. 3.

Figure 13A:
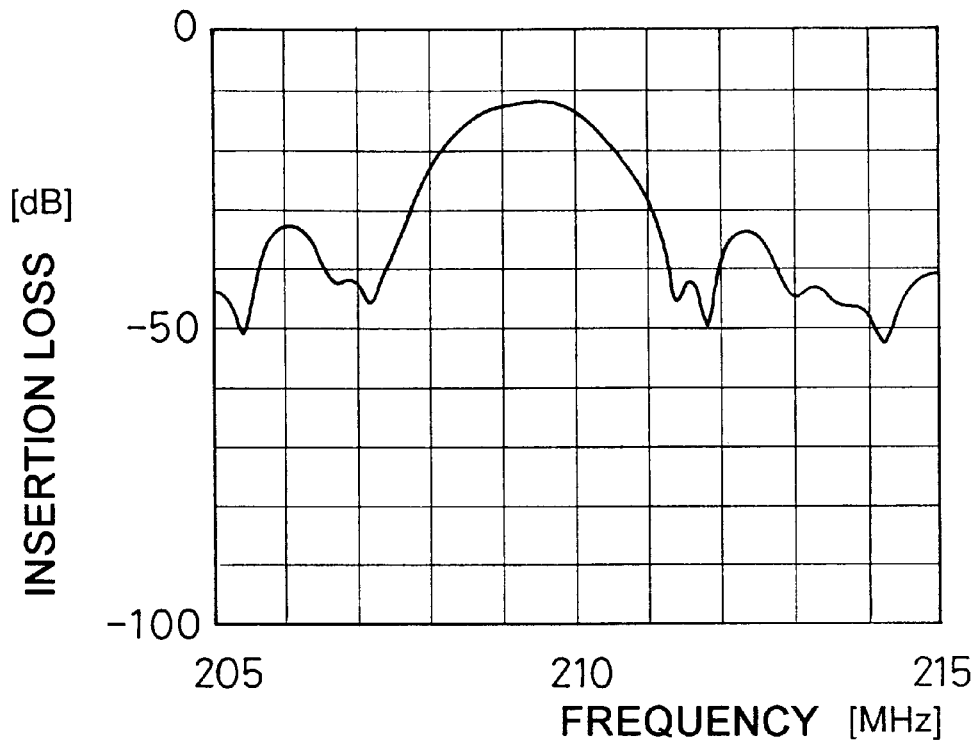
FIG. 13A shows the filter characteristic of a SAW filter in accordance with the present invention when the width of the wider electrode finger is λ/6.
Figure 13B:
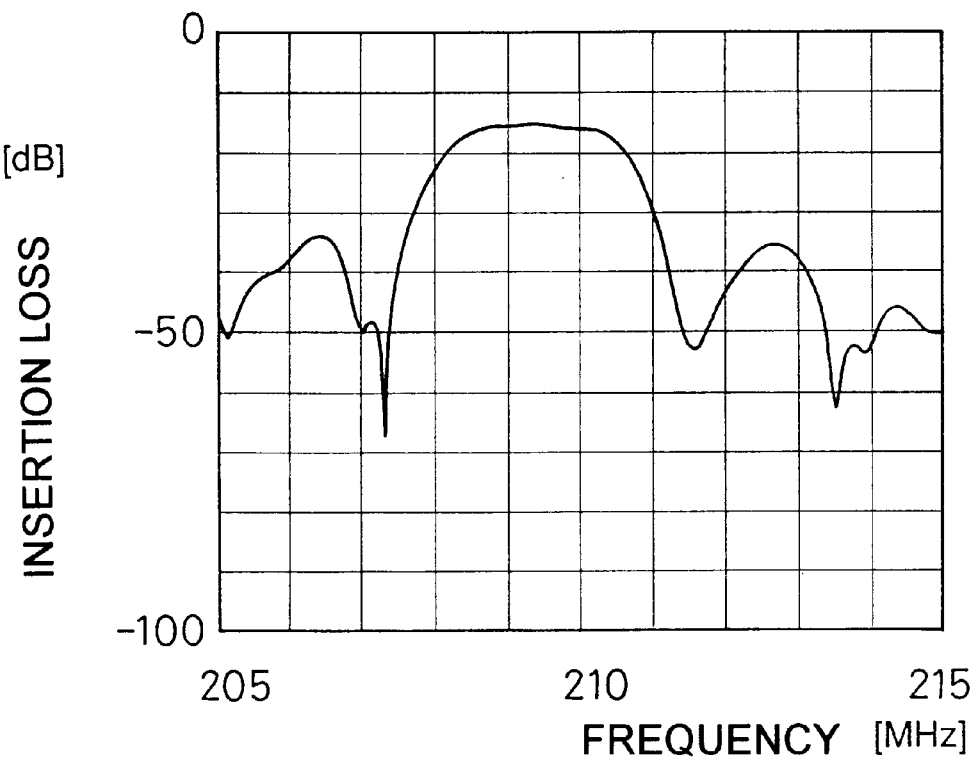
FIG. 13B shows the filter characteristic of a conventional SAW filter when the width of the wider electrode finger is λ/6.
Figure 14A:
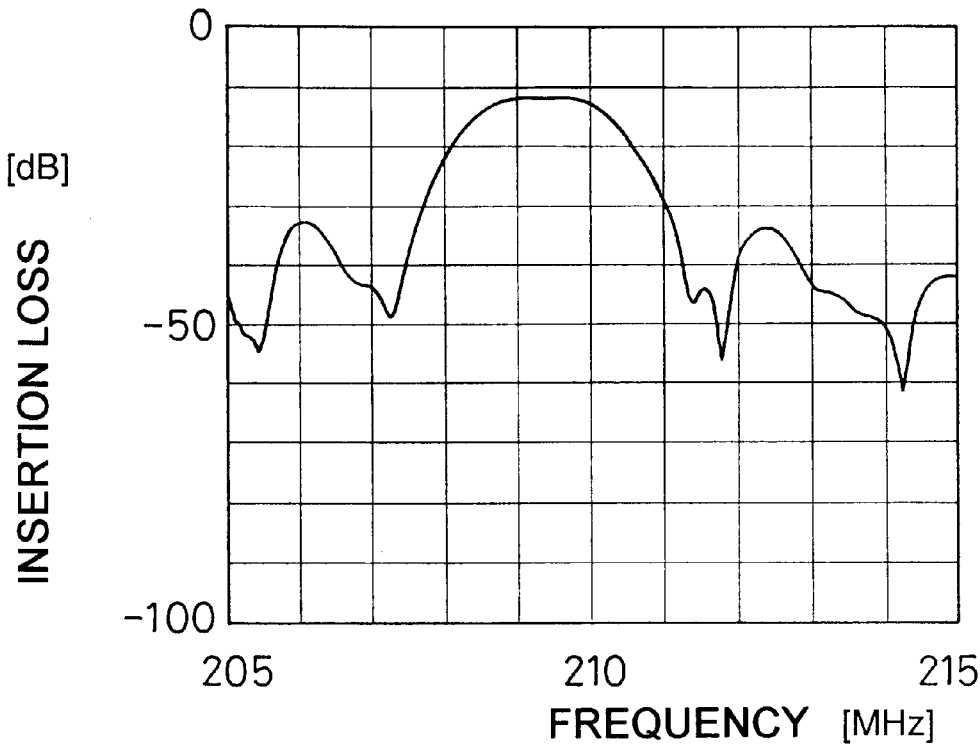
FIG. 14A shows the filter characteristic of a SAW filter in accordance with the present invention when the width of the wider electrode finger is λ/4.
Figure 14B:
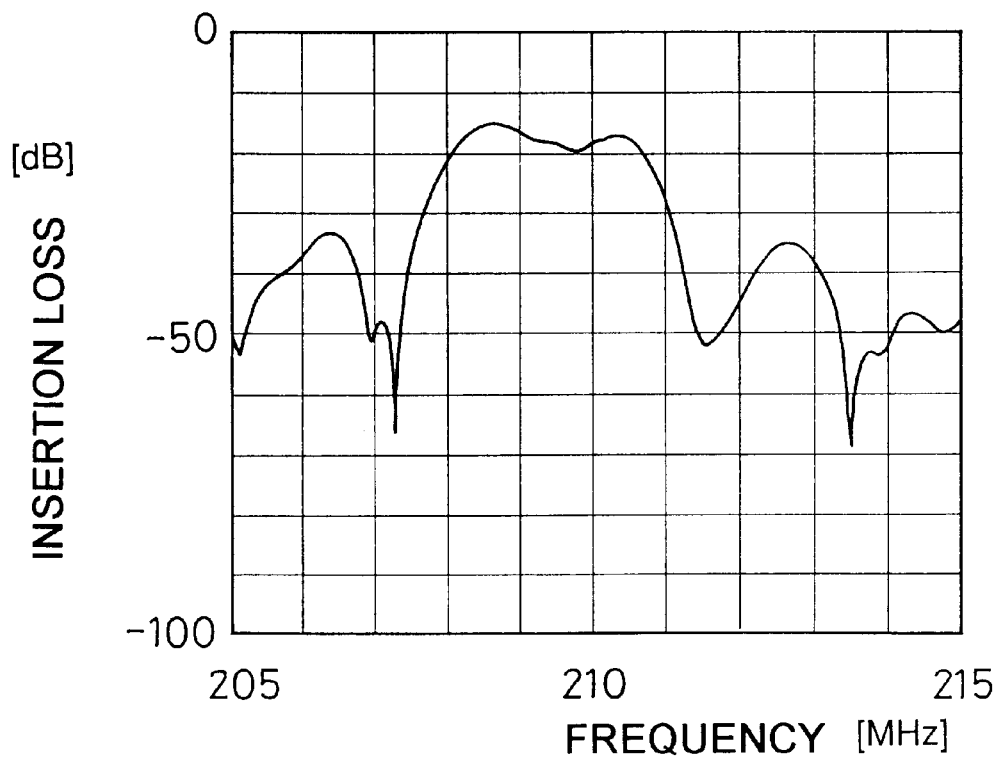
FIG. 14B shows the filter characteristic of a conventional SAW filter when the width of the wider electrode finger is λ/4.
Figure 15:
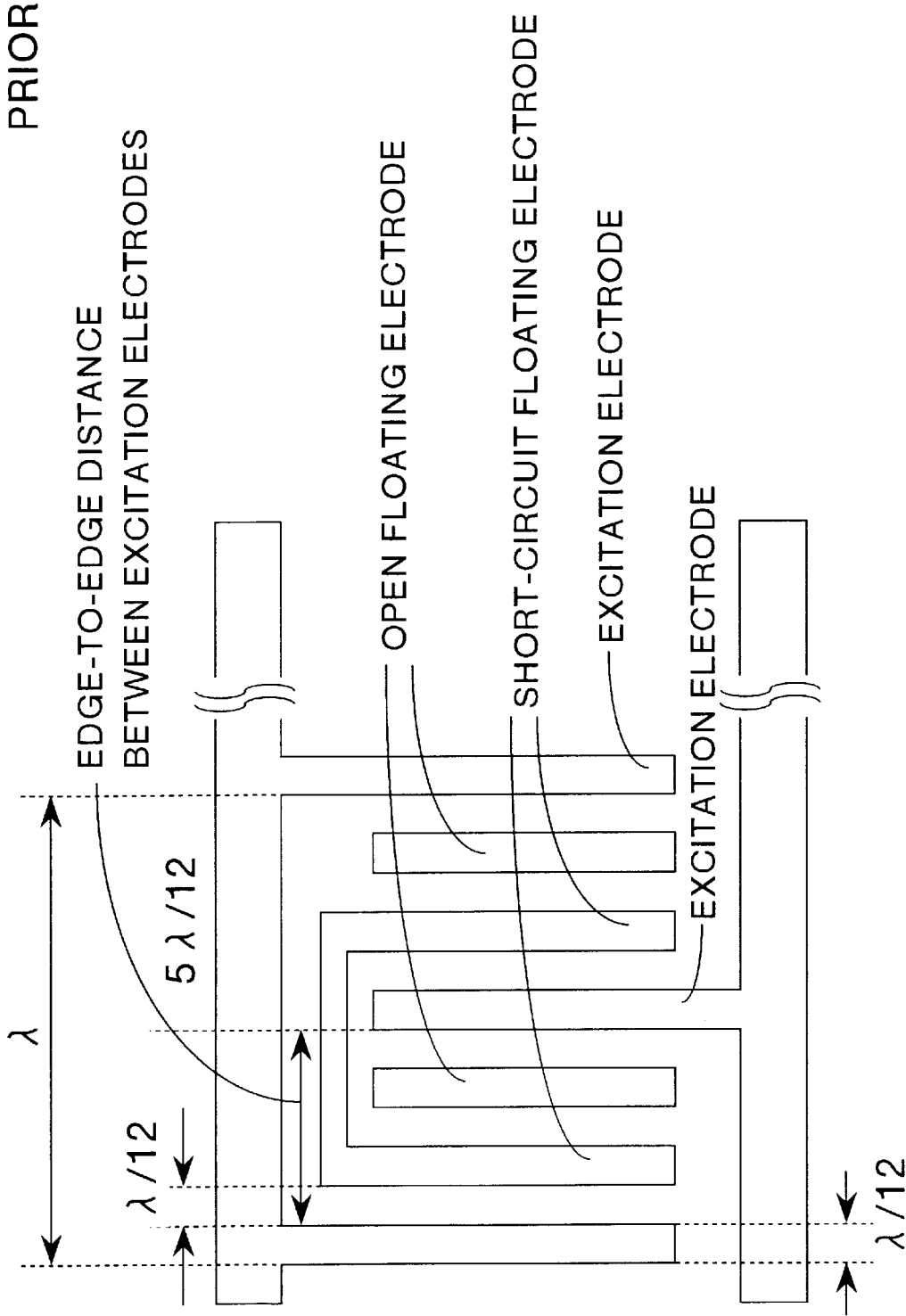
FIG. 15 is a schematic view illustrating the construction of a conventional unidirectional IDT of internal reflection type using a floating electrode.
Figure 16:
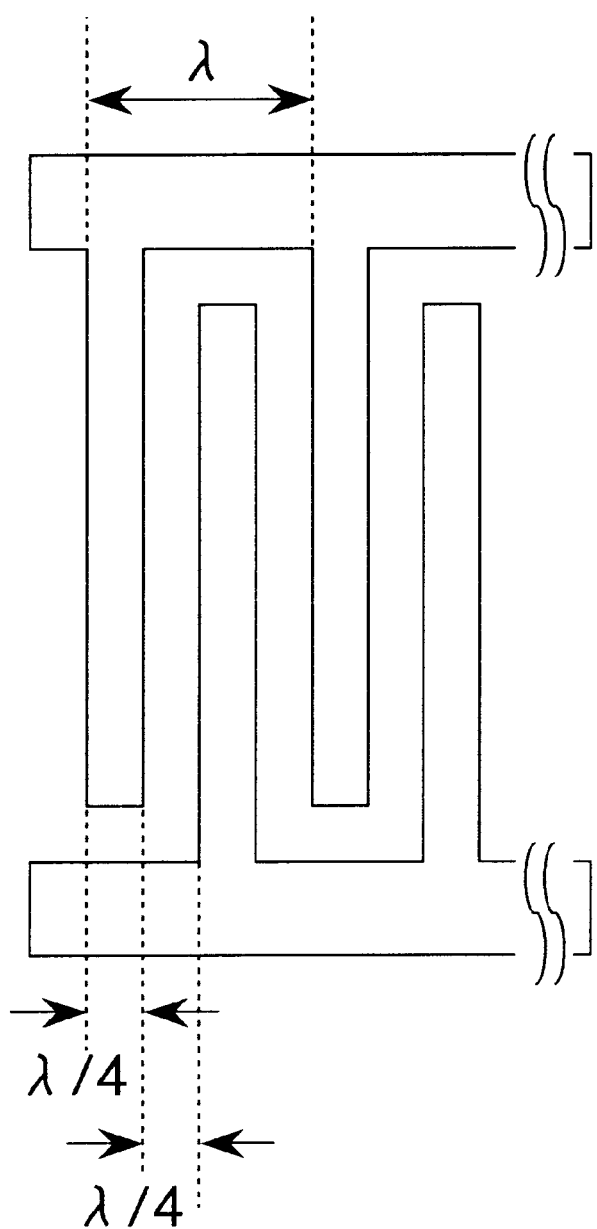
FIG. 16 is a schematic view illustrating the construction of a conventional bidirectional IDT (with single electrodes)

Next, FIGS. 13A and 14A show the filter characteristics of SAW filters in which the width of the wider electrode finger of the unidirectional IDT is changed to λ/6 and λ/4, respectively. The arrangement of the split electrodes of the unidirectional IDT is the same as in FIG. 3. For comparison, FIG. 13B and FIG. 14B show the filter characteristics of SAW filters in which the unidirectional IDT is arranged as in FIG. 19.

FIGS. 13A, 13B, 14A and 14B show that even if the width of the wider electrode finger is changed to λ/6 or λ/4, a low-loss SAW filter free of ripples can be produced by the arrangement shown in FIG. 3. Also a low-loss SAW filter free of ripples can be produced by the arrangement shown in FIG. 3 in the case of 36° Y-X: quartz, one of various rotated Y-X: quartz.

It is to be noted that, though only the construction shown in FIG. 3 has been explained in this example, low-loss SAW filters free of ripples can also be produced by utilizing the constructions shown in FIGS. 4 to 7.

According to the present invention, when a piezoelectric substrate of rotated Y-X: quartz, 45° X-Z: Li$_2$B$_4$O$_7$ or X- 112° Y: LiTaO$_3$ is used, good characteristics of low-loss and free of ripples can be obtained because the direction from the narrower one of the electrode finger pair of the unidirectional IDT to the wider one thereof is conformed to the direction in which the SAW excited by the unidirectional IDT propagates to the receiver IDT.

Further, though the two directions agree with each other in the above description of the example, the two directions are not required to coincide with each other completely. If the angle α defined by the two directions is smaller than 90° (0≦α<90°), good characteristics of low-loss and free of ripples can be obtained since the direction of the SAW propagation is not opposite to the direction from the narrower electrode finger to the wider electrode finger.

According to the present invention, in a SAW device comprising a plurality of IDTs placed on a piezoelectric substrate, the IDT provided with split electrodes composed of pairs of electrode fingers is so constructed that the direction transverse to the electrode fingers from the electrode finger having a smaller reflection factor to the electrode finger having a larger reflection factor conforms substantially with the direction in which the SAW excited by the IDT travels to the receiver IDT. Thus, a SAW device having a good frequency characteristic of low-loss and free from ripples can be obtained.

Further, the IDT provided with the split electrodes is so constructed such that the direction traverse to the electrode fingers from the narrower electrode finger of the split electrode to the wider electrode finger of the split electrode coincides substantially with the direction in which the SAW excited by the IDT travels to the receiver IDT. Thus, a SAW device having a good frequency characteristic of low-loss and free from ripples can also be obtained.

Particularly, when any of rotated Y-X: quartz, 45° X-Z: Li$_2$B$_4$O$_7$ and X- 112° Y: LiTaO$_3$ is used as material for the piezoelectric substrate, the SAW device can have a good frequency characteristic of low-loss and free of ripples.

What is claimed is:

1. A surface acoustic wave device comprising:
   a piezoelectric substrate; and
   a plurality of interdigital transducers sending and receiving surface acoustic waves mounted on a surface of the piezoelectric substrate, wherein
   at least one of the interdigital transducers is composed of a positive electrode including a plurality of positive split electrodes and a negative electrode including a plurality of negative split electrodes, the positive and negative split electrodes being arranged alternately, each of the positive and negative split electrodes having a pair of electrode fingers,
   two electrode fingers of each of the positive and negative split electrodes are different in width in a direction in which a surface acoustic wave is excited,
   an angle α determined by a direction transverse to the electrode fingers from one of the two electrode fingers having a smaller width toward the other one of the two electrode fingers having a larger width and a direction in which the surface acoustic wave excited by the interdigital transducer including the split electrodes travels to one of the interdigital transducers for receiving the surface acoustic wave is equal to or larger than 0° and smaller than 90° and
   the piezoelectric substrate is a substrate of rotated Y-X:quartz.

2. A surface acoustic wave device comprising:
   a piezoelectric substrate; and a plurality of interdigital transducers sending and receiving surface acoustic waves mounted on a surface of the piezoelectric substrate, wherein at least one of the interdigital transducers is composed of a positive electrode including a plurality of positive split electrodes and a negative electrode including a plurality of negative split electrodes, the positive and negative split electrodes being arranged alternately, each of the positive and negative split electrodes having a pair of electrode fingers, two electrode fingers of each of the positive and negative split electrodes are different in width in a direction in which a surface acoustic wave is excited, an angle $\alpha$ determined by a direction transverse to the electrode fingers from one of the two electrode fingers having a smaller width toward the other one of the two electrode fingers having a larger width and a direction in which the surface acoustic wave excited by the interdigital transducer including the split electrodes travels to one of the interdigital transducers for receiving the surface acoustic wave is equal to or larger than 0° and smaller than 90°, and the piezoelectric substrate is a substrate of any of 36° Y-X quartz, X-112° Y:$LiTaO_3$ and 45° X-Z:$Li_2B_4O_7$.

* * * * *